United States Patent
Wu et al.

(10) Patent No.: US 9,021,412 B2
(45) Date of Patent: *Apr. 28, 2015

(54) RC EXTRACTION METHODOLOGY FOR FLOATING SILICON SUBSTRATE WITH TSV

(71) Applicant: Taiwan Semiconductor Manufacturing Co., Ltd., Hsin-Chu (TW)

(72) Inventors: Ze-Ming Wu, Tainan (TW); Ching-Shun Yang, Zhudong Township (TW); Ke-Ying Su, Taipei (TW); Hsiao-Shu Chao, Baoshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/087,065

(22) Filed: Nov. 22, 2013

(65) Prior Publication Data

US 2014/0082578 A1 Mar. 20, 2014

Related U.S. Application Data

(63) Continuation of application No. 13/366,756, filed on Feb. 6, 2012, now Pat. No. 8,607,179.

(60) Provisional application No. 61/563,626, filed on Nov. 25, 2011.

(51) Int. Cl.
*G06F 17/50* (2006.01)

(52) U.S. Cl.
CPC ........ *G06F 17/5036* (2013.01); *G06F 17/5068* (2013.01)

(58) Field of Classification Search
CPC ............ G06F 17/5036; G06F 17/5068; H01L 21/768
USPC .................................. 716/106, 110, 111, 115
See application file for complete search history.

(56) References Cited

U.S. PATENT DOCUMENTS

| | | | | |
|---|---|---|---|---|
| 8,146,032 | B2* | 3/2012 | Chen et al. | 716/106 |
| 8,269,350 | B1 | 9/2012 | Chen et al. | |
| 2010/0199236 | A1 | 8/2010 | Chen et al. | |
| 2013/0007692 | A1* | 1/2013 | Yeh et al. | 716/136 |
| 2013/0032799 | A1* | 2/2013 | Yen et al. | 257/48 |

OTHER PUBLICATIONS

Weng Fook Lee, "Chapter Two: ASIC Design Flow", Verilog Coding for Logic Synthesis, 2003, p. 3-15.
Non-Final Office Action dated Jan. 23, 2013 for U.S. Appl. No. 13/366,756.
Final Office Action dated Jun. 4, 2013 for U.S. Appl. No. 13/366,756.
Notice of Allowance dated Aug. 8, 2013 for U.S. Appl. No. 13/366,756.

* cited by examiner

*Primary Examiner* — Vuthe Siek
(74) *Attorney, Agent, or Firm* — Eschweiler & Associates, LLC

(57) ABSTRACT

The present disclosure relates to methods and apparatuses for generating a through-silicon via (TSV) model for RC extraction that accurately models an interposer substrate comprising one or more TSVs. In some embodiments, a method is performed by generating an interposer wafer model having a sub-circuit that models a TSV. The sub-circuit can compensate for limitations in resistive and capacitive extraction of traditional TSV models performed by EDA tools. In some embodiments, the sub-circuit is coupled to a floating common node of the model. The floating common node enables the interposer wafer model to take into consideration capacitive coupling within the interposer. The improved interposer wafer model enables accurate RC extraction of an interposer with one or more TSVs, thereby providing for an interposer wafer model that is consistent between GDS and APR flows.

18 Claims, 5 Drawing Sheets

US 9,021,412 B2

RC EXTRACTION METHODOLOGY FOR FLOATING SILICON SUBSTRATE WITH TSV

REFERENCE TO RELATED APPLICATIONS

This application is a continuation patent application that claims priority to U.S. patent application Ser. No. 13/366,756 filed Feb. 6, 2012 entitled "RC Extraction Methodology for Floating Silicon Substrate with TSV" which claims priority to U.S. Provisional Patent Application Ser. No. 61/563,626 filed on Nov. 25, 2011, entitled "RC Extraction Methodology for Floating Silicon Substrate with TSV", which is hereby incorporated in its entirety.

BACKGROUND

The semiconductor industry has continually improved the processing capabilities and power consumption of integrated chips (ICs) by shrinking the minimum feature size of chip components through improvements in lithographic processes. However, in recent years process limitations have made it difficult to support the continued shrinking of minimum feature size. The vertical integration of ICs has emerged as a potential alternative approach to improving integrated chip performance. By vertically integrating IC die to behave as a single chip, metal interconnect distance is shortened, thereby improving processing capabilities and reducing power consumption.

In many vertically integrated IC structures, an interposer is configured to carry one or more IC die. The interposer provides for structural stability, improved heat dissipation, improved interconnection characteristics, etc. Micro-bumps connect respective IC die to through-silicon vias (TSV), which are vertical electrical connections extending through the interposer. In general, a TSV is comprised of a conductive metal, such as copper or tungsten, and is surrounded by a dielectric layer.

DETAILED DESCRIPTION

Figure 1:
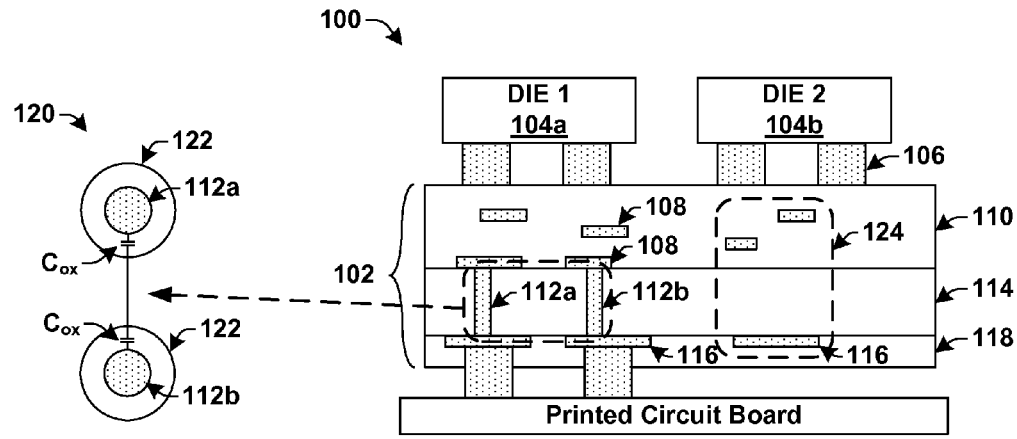
FIG. 1 illustrates an exemplary cross section of a 2.5 dimensional integrated chip having an interposer with a plurality of through-silicon vias.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

It will be appreciated that although the methods and apparatuses illustrated and described herein relate to a 2.5 dimensional integrated chip, that the disclosed methods and apparatuses are not limited to such a description. For example, the disclosed methods and apparatuses may also be applied to a three dimensional integrated chip (i.e., a 2.5d integrated chip with one or more additional integrated chip die stacked vertically above the 2.5d IC die).

FIG. 1 illustrates an exemplary cross section of a 2.5 dimensional integrated chip (2.5D-IC) 100. The 2.5D-IC 100 comprises a plurality of integrated chip die 104a, 104b positioned on an interposer 102. The IC die 104a, 104b are connected to conductive interconnect metal layers that allow for vertical integration of the IC die 104a, 104b. The conductive interconnect metal layers comprise front-side routing metal layers 108, through-silicon vias 112a and 112b, and back-side routing metal layers 116. The IC die 104a, 104b are connected to the front-side routing metal layers 108, located within a first dielectric material 110, by way of one or more micro bumps 106. The front-side routing metal layers 108 are further connected to one or more through-silicon vias (TSV) 112a, 112b, which extend through an interposer substrate 114 comprising a semiconductor material. The one or more TSVs 112a, 112b are further connected to one or more back-side routing metal layers 116 located within a second dielectric material 118.

As shown in cross sectional view 120, a TSV dielectric layer 122 is configured between the TSVs 112a, 112b and the interposer substrate 114. The TSV dielectric layer 122 results in a capacitance $C_{ox}$ between the TSVs 112a, 112b and the interposer substrate 114. A similar capacitance exists between the routing metal layers 108, 116 and the interposer substrate 114. Such capacitances cause cross-substrate capacitive coupling between conductive elements of the interposer 102, such as for example, TSV-to-TSV capacitive coupling and/or front-side to back-side routing metal layer capacitive coupling. These cross-substrate capacitive couplings are a significant source of noise that can result in functional failures of the integrated chip. Therefore, for proper 2.5D-IC design, cross-substrate capacitive coupling between conductive elements within the interposer 102 must be taken into consideration to ensure signal integrity.

Accordingly, during 2.5D-IC design, EDA (Electronic Design Automation) tools are used to perform RC extraction of the TSVs. The extracted RC values are then utilized along with a model of the TSV for statistical timing analysis of the TSV design. The inventors have appreciated that current EDA tools used for RC extraction have limitations in modeling TSV.

Figure 2:
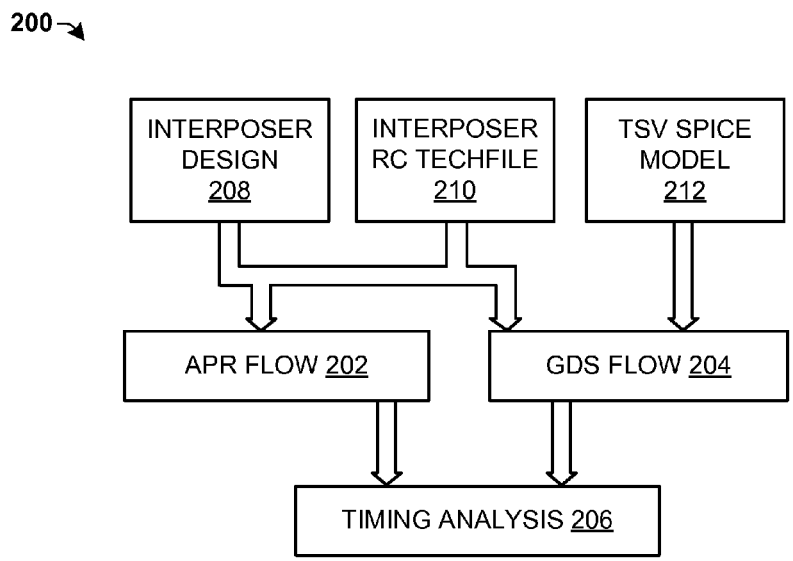
FIG. 2 illustrates a block diagram of an exemplary design flow for timing analysis of an interposer having one or more through-silicon vias.

For example, FIG. 2 illustrates a block diagram of an exemplary design flow 200 for designing a 2.5D-IC. The design flow 200 utilizes both an automated place and route (APR) flow 202, which typically models a TSV as a resistive via, and a GDS flow 204, which typically models a TSV as a device.

The APR flow 202 utilizes automated routers to perform design steps such as floorplanning, placement of functional IC blocks, routing of IC blocks, etc. To ensure proper placement and routing of the IC blocks, the automated routers utilize an EDA tool for extraction of parasitic parameters. In some embodiments, the EDA tool comprises an RC extraction tool, such as for example StarRC, xRC, or QRC. As shown in FIG. 2, the APR flow 202 utilizes a model of an interposer design 208 and an RC techfile 210 to generate an APR netlist of the interposer. The interposer design 208 comprises a high level hardware description of an interposer. The RC techfile 210 comprises extracted parasitic RC parameters of a TSV received from an EDA tool. Statistical timing analysis is then performed on the APR netlist by way of a statistical static timing analysis (SSTA) tool, such as for example Primetime.

The EDA tools used by the APR flow 202 to generate the RC techfile 210 typically operates based upon the assumption that the TSV 112 and TSV dielectric layer 122 are cubic in shape and that the interposer substrate 114 is a grounded conductor. However, modeling the TSV 112 and TSV dielectric layer 122 as cubic in shape results in inaccurate RC extraction of the TSV 112. Furthermore, modeling the interposer substrate 114 as a grounded conductor prevents proper modeling of cross-substrate coupling between conductive elements within the interposer (e.g., TSV-to-TSV and front-side to back-side capacitive coupling).

The GDS flow 204 is performed to generate a GDS file. The GDS flow 204 performs further, more detailed timing analysis of a design. The GDS flow 204 utilizes a Spice simulator (e.g., HSPICE, ELDO, Smart Spice, etc.) that operates on a netlist to perform timing analysis 206. The netlist is generated based upon the interposer design 208 and the RC techfile 210 generated by the EDA tool. The Spice simulator accounts for RC values of the TSV model when performing the timing analysis, by using a TSV Spice model 212 that treats the TSV 112 and TSV dielectric layer 122 as conic in shape.

While the TSV Spice model 212 models a TSV's capacitance and floating substrate behavior very well, the EDA extraction tool that performs RC extraction fails to accurately model a TSV's capacitance and cross-substrate coupling (TSV-to-TSV & front-side to back-side coupling). Therefore, there are inconsistencies in the APR and GDS design flow that may cause inaccurate timing analysis of the interposer.

Accordingly, some aspects of the present disclosure provide methods and apparatuses for generating a TSV model for RC extraction that accurately models an interposer substrate comprising one or more TSVs. In some embodiments, a method comprises generating an interposer wafer model comprising a sub-circuit that models a TSV. The sub-circuit is configured to compensate for limitations in resistive and capacitive extraction of traditional TSV models performed by EDA tools. In some embodiments, the sub-circuit is coupled to a floating common node of the model. The floating common node enables the interposer wafer model to take into consideration capacitive coupling within the interposer. The improved interposer wafer model enables accurate RC extraction of an interposer with one or more TSVs, thereby providing for an interposer wafer model that is consistent between GDS and APR flows.

Figure 3:
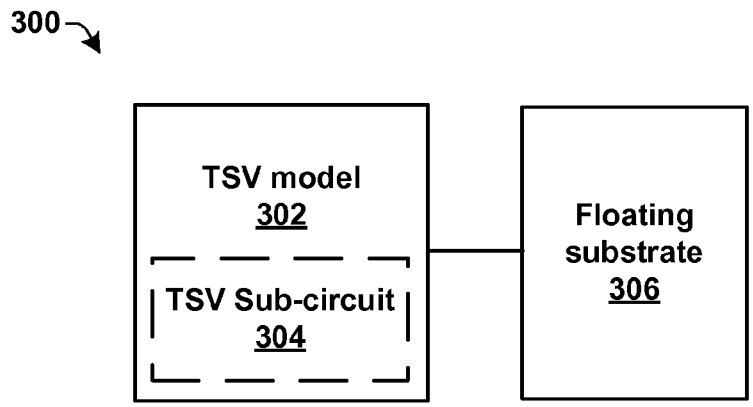
FIG. 3 illustrates a block diagram of some embodiments of an interposer wafer model for RC extraction of an interposer having one or more through-silicon vias.

FIG. 3 illustrates a block diagram of some embodiments of an interposer wafer model 300 for RC extraction of an interposer having one or more through-silicon vias. The interposer wafer model 300 reduces the variation in RC modeling of an interposer between GDS and APR flows.

The interposer wafer model 300 includes a TSV model 302 that is used to model a through-silicon via. The TSV model 302 comprises a user specified TSV sub-circuit 304 having one or more circuit components that can be read by an EDA extraction tool. The TSV sub-circuit 304 has one or more circuit components that are configured to account for inaccuracies in modeling of the TSV 112 and the TSV dielectric layer 122 as having a cubic shape.

The TSV sub-circuit 304 comprises components that react to cross-substrate coupling (e.g., TSV-to-TSV capacitive coupling and/or front-side to back-side routing metal layer capacitive coupling) over a wide range of IC chip operating frequencies to provide for an accurate modeling of the TSV's resistance and capacitance. For example, in some embodiments, the TSV sub-circuit 304 comprises frequency dependent components that account for the affect of cross coupling capacitance of the interposer substrate.

In some embodiments, the TSV model 302 is based upon the content of a traditional TSV model. In such embodiments, the TSV model 302 may comprise the traditional TSV model (e.g., which models the TSV as a via) along with a TSV sub-circuit 304 comprising one or more additional circuit components that provide for accurate modeling of the TSV's resistance and capacitance. For example, the TSV model 302 may be generated from a netlist of a traditional TSV model and may include a TSV sub-circuit 304 having one or more additional circuit components added to the netlist.

In some embodiments, the user specified TSV sub-circuit 304 replaces a traditional TSV model and operates as the TSV model 302. For example, a traditional TSV model (e.g., which models the TSV as a via) may be replaced with a TSV sub-circuit 304 comprising an RC network. In some embodiments, the TSV sub-circuit 304 comprises an RLCKG network, having resistive (R), capacitive (C), inductive (L), conductive (G), and mutually inductive (K) elements. The RLCKG network can comprise a parallel RLCKG network or a series RLCKG network in various embodiments.

The TSV model 302 is further connected to a floating common node 306. The floating common node 306 is a non-grounded node that is not tied to a ground voltage but that is a floating reference node having a non-zero reference voltage. This is in contrast to typical interposer wafer models that model the interposer as a grounded terminal having a zero reference voltage. The use of a floating common node 306 results in accurate modeling of the interposer, since the interposer is made of a semiconductor material that operates as a floating substrate that is not tied to ground.

The floating common node 306 enables accurate modeling of cross-substrate coupling between conductive materials within the interposer, such as for example, the TSV-to-TSV coupling and coupling between front-side and back-side metal routing layers. The floating common node 306 enables such cross-substrate coupling by allowing any TSV model to be connected to other conductive elements in an interposer wafer through the substrate (i.e., through the floating node). For example, the floating common node 306 does not shield signals between conductive layers within the interposer.

It will be appreciated that interposer wafer model 300 is a non-limiting embodiment. In some embodiments, the interposer wafer model 300 may comprise some, but not all elements shown in FIG. 3. For example, in some embodiments, the interposer wafer model 300 may connect a traditional TSV model (i.e., without a sub-circuit 304) to a floating node 306. This enables the TSV model 302 to take into consideration capacitive coupling between elements within an interposer. In alternative embodiments, the model 300 may replace a TSV model 302 with a TSV sub-circuit 304 to enable correct modeling of the TSV resistance and capacitance (i.e., without a floating node 306).

Figure 4:
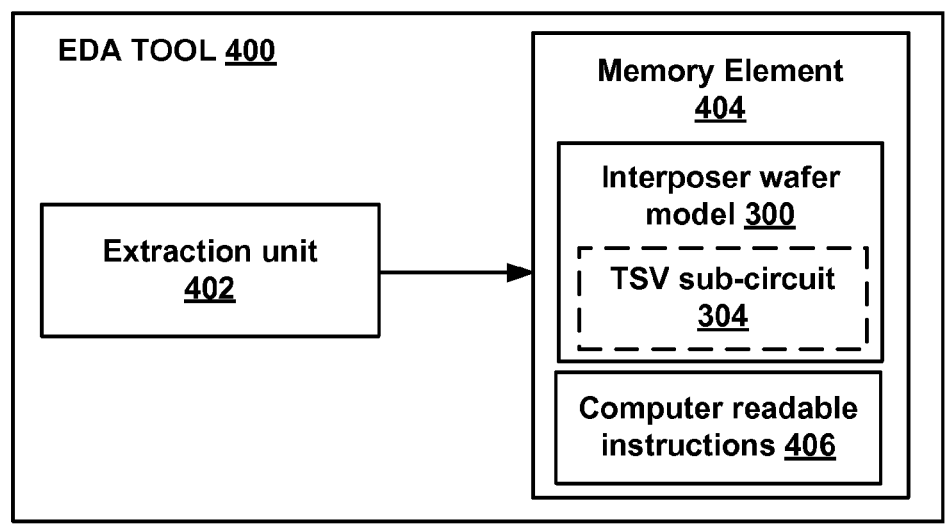
FIG. 4 illustrates a block diagram of some embodiments of an EDA tool configured to execute the disclosed interposer wafer model for RC extraction.

FIG. 4 illustrates some embodiments of an electronic design automation (EDA) tool 400 configured to implement an interposer wafer model for RC extraction of an interposer having one or more through-silicon vias.

The EDA tool 400 comprises a memory element 404. In various embodiments the memory element 404 may comprise an internal memory or a computer readable medium. The memory element 404 is configured to store a disclosed interposer wafer model 300, which models an interposer substrate as a floating common node, as described above. The interposer wafer model 300 may further comprise a user-specified TSV sub-circuit 304. An extraction unit 402 is configured to utilize the interposer wafer model 300 to extract one or more parasitic parameters, such as for example a capacitance and a resistance comprising two separate resistors connected in series, of the TSV vias within an interposer.

In some embodiments, the memory element 404 further comprises computer-executable instructions. The computer readable instructions may provide for a method of generating an interposer wafer model, as disclosed in method 600 or a method of RC extraction of an interposer having one or more through-silicon vias, as disclosed in method 900.

Figure 5:
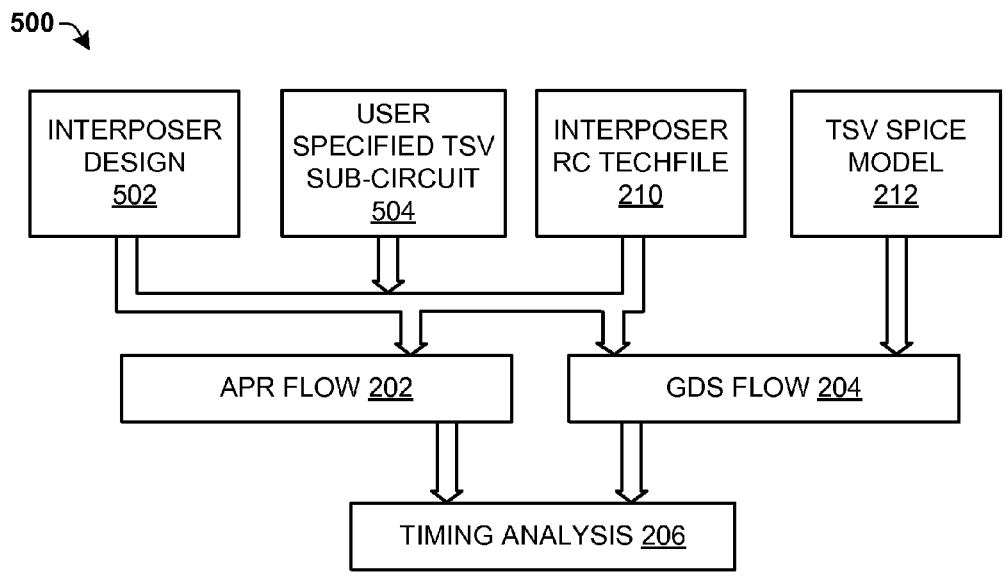
FIG. 5 illustrates a block diagram of an embodiment of a design flow for timing analysis of the disclosed model for RC extraction of an interposer having one or more through-silicon vias.

FIG. 5 illustrates a block diagram of an exemplary design flow 500 for timing analysis of the disclosed interposer wafer model for RC extraction of an interposer having one or more through-silicon vias. The design flow 500 ensures consistency between GDS flows 202 and APR flows 204.

The design flow 500 takes into consideration the user specified TSV sub-circuit 504 to generate an APR netlist in the APR flow 202. Because the APR flow 202 takes into consideration the user specified TSV sub-circuit 504, the APR flow accurately performs RC extraction of a TSV's resistance and capacitance. Furthermore, because the interposer design 502 comprises an interposer wafer model having conductive elements within the interposer connected to a floating common node, both the APR flow 202 and the GDS flow 204 can accurately account for cross-substrate coupling within the interposer.

Figure 6:
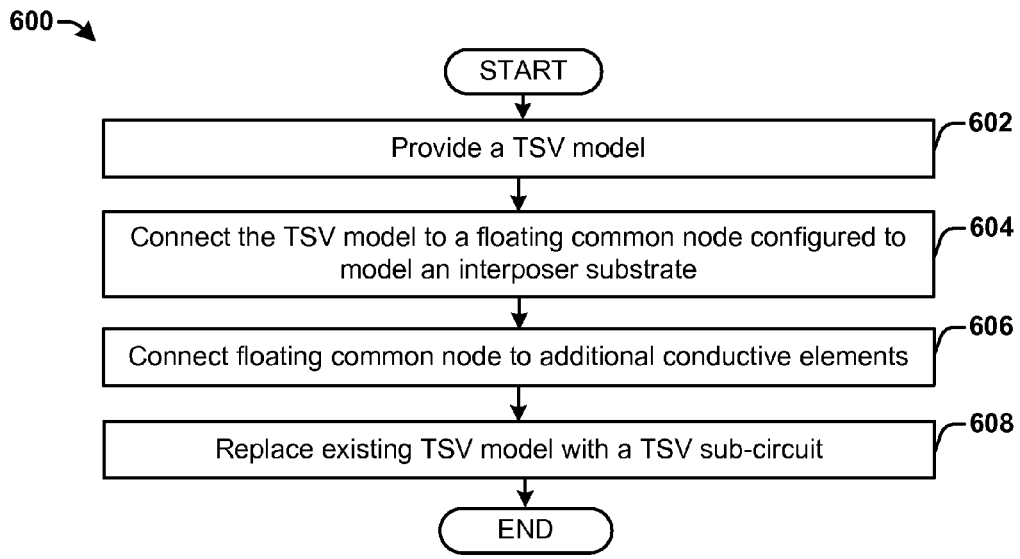
FIG. 6 is a flow diagram of some embodiments of a method for generating an interposer wafer model for RC extraction of an interposer having one or more through-silicon vias.

FIG. 6 is a flow diagram of some embodiments of a method 600 for generating an interposer wafer model for RC extraction of an interposer having one or more through-silicon vias.

While the method 600 provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 602 a through-silicon via model for parasitic extraction of an interposer wafer design is provided. The TSV model represents a TSV as one or more circuit components. In one embodiment, the through-silicon via model models the TSV as a resistor.

At 604 the through-silicon via model is connected to a floating common node configured to model an interposer substrate. The floating common node enables accurate modeling for cross-substrate coupling between conductive elements within the interposer substrate.

At 606, the floating common node is connected to additional conductive elements within the interposer. By connecting the floating common node to one or more additional conductive elements within the interposer, proper modeling of cross-coupling between the TSV and the conductive elements is enabled. In some embodiments, the additional conductive elements may comprise TSVs and/or routing metal layers.

At 608 an existing TSV model is replaced with a TSV sub-circuit so that the TSV model comprises a TSV sub-circuit. The TSV sub-circuit is configured to accurately describe resistance and capacitive of the TSV.

Figure 7A:
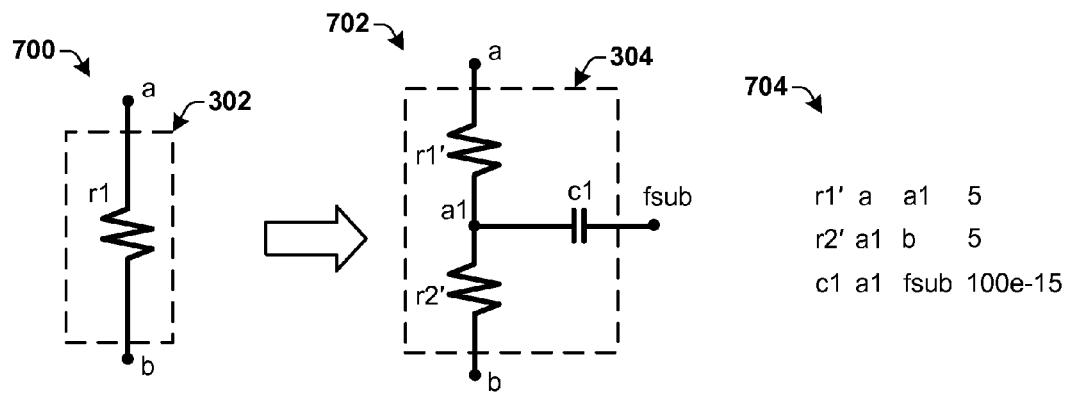
FIG. 7a illustrates some embodiments of a model of a through-silicon via comprising a user specified sub-circuit.
Figure 7B:
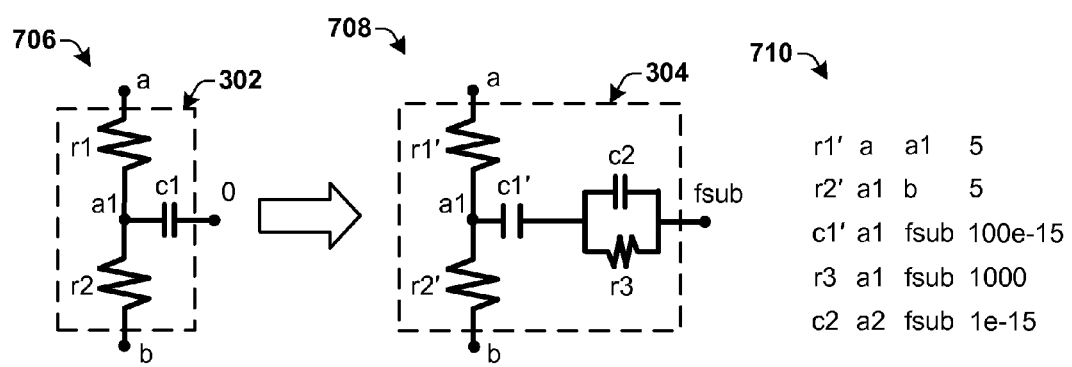
FIG. 7b illustrates some alternative embodiments a model of a through-silicon via comprising a user specified sub-circuit.

It will be appreciated that different RC extraction tools model TSVs differently. For example, some RC extraction tools model TSVs as a resistor, while other RC extraction tools model TSVs as an RC circuit. FIGS. 7a-7b illustrate two examples of traditional TSV models used by RC extraction tools and corresponding TSV user specified sub-circuit and netlists according to the present disclosure.

FIG. 7a shows some embodiments of a model of a through-silicon via comprising a user specified sub-circuit. In the embodiments of FIG. 7a, a traditional TSV model 700 used by an extraction tool models a TSV as a resistor r1, which has a resistance of 5 ohms. Since the resistor r1 is modeled in the RC extraction tool based upon a TSV having a cubic shape, it has an incorrect resistive value. Furthermore, TSV model 700 does not account for capacitive coupling between the TSV and the TSV dielectric layer (e.g., element 122 in FIG. 1).

Accordingly, the traditional TSV model 700 can be replaced with a user specified TSV sub-circuit 702 according to the present disclosure. The user specified sub-circuit 702 comprises a first resistor r1' connected to a capacitor c1 and a second resistor r2'. The use of two resistors r1' and r2' accounts for the incorrect resistive value of traditional TSV model 700 by providing a cumulative resistance of 10 ohms. Furthermore, capacitor c1 accounts for the failure of traditional TSV model 700 to take into account the capacitance of the TSV's dielectric layer. Therefore, the user specified TSV sub-circuit 702 enables accurate modeling of the TSV.

In some embodiments, the capacitor c1 is further coupled to a floating common node "fsub" configured to model an interposer substrate. The use of a floating common node fsub enables coupling capacitance between other conductive elements of the substrate to be taken into consideration in RC extraction. In other words, the use of the floating common node fsub allows for the TSV sub-circuit 702 to be electrically coupled to additional circuit components. A netlist corresponding to TSV sub-circuit 702 is shown at 704. The netlist 704 comprises a netlist of the traditional TSV model 700 along with additional circuit components and a floating common node, which allow for accurate modeling of RC parameters.

FIG. 7b shows a traditional TSV model 706 used by an extraction tool for a TSV extracted as a simplified RC circuit having resistors r1 and r2, and a capacitor c1 tied to a grounded node "0". Since the resistors r1 and r2 are modeled in the RC extraction tool as a cubic shape, the cumulative resistance value of r1 and r2 is incorrect. Furthermore, since the TSV's dielectric layer (e.g., element 122 in FIG. 1) is modeled as a cube, the capacitive value of capacitor c1 is also incorrect. Accordingly, the traditional TSV model 706 can be replaced with a user specified TSV sub-circuit 708 according to the present disclosure. User specified sub-circuit 708 comprises a first resistor r1' connected to a capacitor c1' and a second resistor r2'. The user specified sub-circuit 708 further comprises a resistor r3 and capacitor c2 connected in parallel to capacitor c1'. The resistor r3 and capacitor c3 vary the resistive and capacitive value of the model to enable accurate RC extraction.

In some embodiments, the resistor r3 and capacitor c2 are further connected to a floating common node fsub configured to model an interposer substrate. A netlist corresponding to TSV sub-circuit 708 is shown at 710. The netlist 710 comprises a netlist of the traditional TSV model 706 along with additional circuit components and a floating common node, which allow for accurate modeling of RC parameters.

Figure 8:
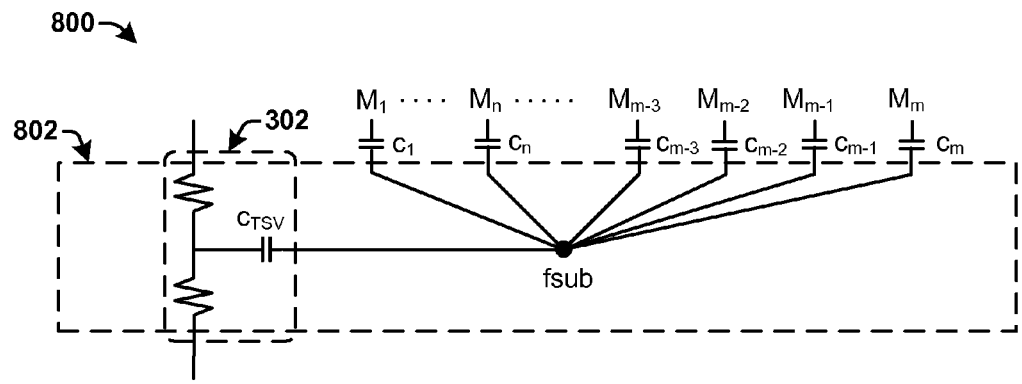
FIG. 8 illustrates a cross sectional view of some embodiments of a model for RC extraction comprising an interposer modeled as a floating node.

FIG. 8 illustrates a cross section of an interposer 800 having an interposer substrate modeled as a floating common node fsub. It will be appreciated that modeling a floating substrate as a floating node can be done in conjunction with a TSV model comprising a user specified TSV sub-circuit or with a traditional TSV model (e.g., comprising a device as shown in 706).

As shown in FIG. 8, the floating common node fsub is coupled to a plurality of front-side common $M_1, \ldots M_m$ within the interposer 800. In alternative embodiments, the floating common node fsub may alternatively or additionally be coupled to back-side routing metal layers and/or other TSVs to allow for proper modeling of TSV-to-TSV coupling as well as front-side to back-side coupling. Because a floating common node is used to model the interposer substrate 802, the noise coupling between two signals is not shielded. For example, when a signal on routing metal layer $M_1$ switches, it affects signals on TSV model 302 and on any other on routing metal layer, such as $M_n$, $M_{m-3}$, etc.

In some embodiments, one or more capacitors may be configured between any two conductive elements. The one or more capacitors properly account for the capacitive coupling of dielectric layers within the interposer. In an embodiment, two series of capacitors are located between any two conductive elements. For example, capacitors $C_{TSV}$ and C1 are located between the TSV model 302 and a first routing metal layer Ml. Capacitor $C_{TSV}$ accounts for the capacitance generated by the TSV dielectric layer, while capacitors $C_1$ accounts for the capacitance generated by the first dielectric layer comprising front-side routing metal layer $M_1$.

By modeling the interposer substrate 802 as a floating common node, cross-substrate capacitive coupling between conductive elements is accounted for in an interposer model that can be used in both GDS or APR flows. For example, interposer substrate 802 is modeled as a floating common node "fsub" that can be added to an APR or GDS netlist.

Figure 9:
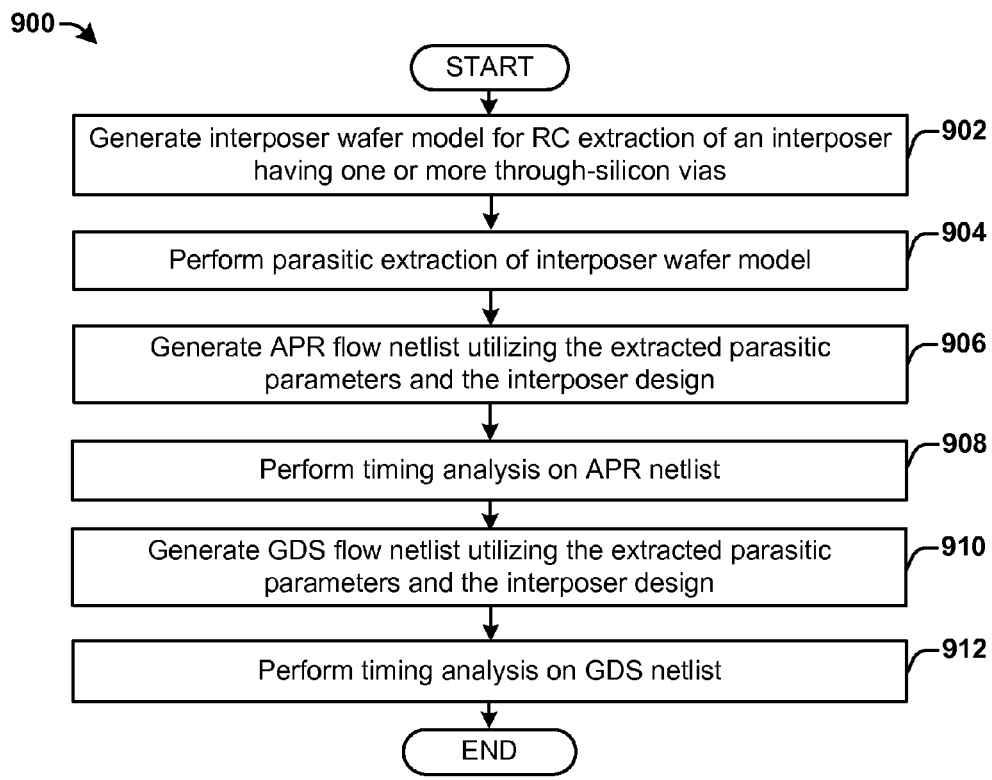
FIG. 9 is a flow diagram of some embodiments of a method of RC extraction of an interposer having one or more through-silicon vias.

FIG. 9 a flow diagram of some embodiments of a method 900 of RC extraction of an interposer having one or more through-silicon vias.

At 902 an interposer wafer model for RC extraction of an interposer having one or more through-silicon vias is generated. In one embodiment the interposer wafer model is generated by replacing an existing model of TSV with a sub-circuit configured to accurate describe resistance and capacitance of the TSV, as described above in method 600. In another embodiment the interposer wafer model is generated by modifying an existing netlist of a traditional TSV model to form a sub-circuit that include one or more additional elements that accurately account for RC modeling.

At 904 parasitic parameters are extracted from the interposer wafer model. In some embodiments, parasitic parameters such as a resistance or capacitance may be extracted by use of an EDA tool.

At 906 an APR flow netlist is generated utilizing the extracted parasitic parameters and the interposer wafer model. Since the extracted parasitic parameters are received from the interpose wafer model, the extracted RC values of the TSV properly describe the TSV. Furthermore, the use of an interposer wafer modeling having a floating common node provides for signal integrity through proper modeling of TSV-to-TSV coupling and cross-substrate coupling.

At 908 timing analysis is performed on the APR flow netlist. The timing analysis on the APR Flow netlist comprises statistical timing analysis performed by way of a statistical static timing analysis (SSTA) tool.

At 910 a GDS flow netlist is generated utilizing extracted parasitic parameters and the interposer wafer model. The use of an interposer wafer model, having a floating common node, provides for signal integrity through proper modeling of TSV-to-TSV coupling and cross-substrate coupling.

At 912 timing analysis is performed on the GDS flow netlist. The timing analysis on the GDS flow netlist is performed by a Spice simulator, which accounts for the TSV RC values during the timing analysis.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein Therefore, the disclosure relates to methods and apparatuses for generating a through-silicon via (TSV) model for RC extraction that accurately models an interposer substrate comprising one or more TSVs. The method and apparatus model an interposer as a floating common node and a TSV within the interposer as a user specified sub-circuit. The floating node enables the model to take into consideration capacitive coupling within the substrate. The user specified sub-circuit compensates for limitations in resistive and capacitive extraction of TSVs models performed by EDA tools.

In some embodiments, the present disclosure relates to a method for generating an interposer wafer model. The method comprises operating an EDA (Electronic Design Automation) tool to provide a through-silicon via (TSV) model comprising information about electrical properties of a through-silicon via (TSV). The method further comprises operating the EDA tool to connect the TSV model to an interposer substrate model that models an interposer substrate through which the TSV extends.

In some embodiments, the present disclosure relates to an EDA tool. The EDA tool comprises a memory element configured to store an interposer substrate model configured to model an interposer substrate, and a through-silicon via model comprising information about electrical properties of a through-silicon via (TSV) that passes through the interposer substrate. The EDA tool further comprises an extraction unit configured to utilize the interposer substrate model to extract one or more parasitic parameters.

In some embodiments, the present disclosure relates to a method for RC extraction of an interposer having one or more through-silicon vias. The method comprises generating an interposer wafer model of an interposer having one or more through-silicon vias, wherein generating the interposer wafer model, comprises providing a through-silicon via (TSV) model comprising information about electrical properties of the one or more through-silicon vias (TSVs), and connecting the TSV model to an interposer substrate model that models the interposer substrate comprising the TSV. RC extraction is performed on the interposer wafer model to generate RC parasitic parameters of the TSV. An APR netlist is generated for use in an APR flow, wherein the APR netlist is based upon the RC parasitic parameters of the TSV and from the interposer wafer model. Timing analysis is performed on the APR netlist utilizing a statistical static timing analysis (SSTA) tool. A GDS netlist is generated for use in a GDS flow, wherein the GDS netlist is based upon the interposer wafer model and the RC parasitic parameters. Timing analysis is performed on the GDS netlist utilizing a Spice simulator that accounts for RC values during the timing analysis on the GDS netlist.

What is claimed is:

1. A method for generating an interposer wafer model, comprising:
   operating an EDA (Electronic Design Automation) tool to provide a through-silicon via (TSV) model comprising information about electrical properties of a through-silicon via (TSV); and
   operating the EDA tool to connect the TSV model to an interposer substrate model that models an interposer substrate through which the TSV extends;
   wherein the TSV model comprises a TSV sub-circuit that reacts to cross-substrate coupling between conductive elements within the interposer substrate over a range of frequencies of operation.

2. The method of claim 1, wherein the TSV model comprises one or more circuit components.

3. The method of claim 2, wherein the one or more circuit components comprise a resistor or a capacitor.

4. The method of claim 1, wherein the interposer substrate model comprises a floating common node that is a non-grounded common node that models the interposer substrate comprising the TSV.

5. The method of claim 1, wherein the TSV sub-circuit has additional circuit components that are configured to account for inaccuracies in modeling of the TSV and a corresponding TSV dielectric layer as having a cubic shape.

6. The method of claim 5, wherein the TSV sub-circuit comprises a RLCKG network.

7. The method of claim 1, wherein the providing the TSV model, comprises:
   modifying an existing TSV model to comprise one or more additional circuit components that enable accurate modeling of a TSV's resistance and capacitance.

8. The method of claim 1,
   wherein the interposer substrate model enables modeling of the cross-substrate coupling between the conductive elements within the interposer substrate, TSV-to-TSV coupling, and coupling between front-side routing metal layers and back-side routing metal layers.

9. An EDA tool, comprising
   a memory element configured to store an interposer wafer model, comprising:
      an interposer substrate model configured to model an interposer substrate;
      a through-silicon via model comprising information about electrical
   properties of a through-silicon via (TSV) that passes through the interposer substrate;
      a TSV sub-circuit having additional circuit components that are configured to account for inaccuracies in modeling of the TSV and a TSV dielectric layer abutting the TSV as having a cubic shape;
   an extraction unit configured to utilize the interposer substrate model to extract one or more parasitic parameters;
   wherein the interposer substrate model is configured to enable modeling of cross-substrate coupling between conductive elements within the interposer substrate.

10. The EDA tool of claim 9, wherein the TSV comprises one or more circuit components.

11. The EDA tool of claim 10, wherein the one or more circuit components comprise a resistor or a capacitor.

12. The EDA tool of claim 9, wherein the interposer substrate model comprises a floating common node that is a non-grounded common node that models the interposer substrate comprising the TSV.

13. The EDA tool of claim 9, wherein the TSV sub-circuit comprises a RLCKG network.

14. A method for RC extraction of an interposer having one or more through-silicon vias, comprising:
   generating an interposer wafer model of an interposer substrate having one or more through-silicon vias (TSVs) using an EDA (Electronic Design Automation) tool, wherein generating the interposer wafer model, comprises:
      providing a through-silicon via (TSV) model comprising information about electrical properties of the one or more through-silicon vias (TSVs), wherein the TSV model comprises a TSV sub-circuit having additional circuit components configured to account for inaccuracies in modeling of the TSV and a corresponding TSV dielectric layer as having a cubic shape,
      connecting the TSV model to an interposer substrate model that models the interposer substrate comprising the one or more TSVs; and
   performing RC extraction of the interposer wafer model, having the TSV model and the interposer substrate model, to generate RC parasitic parameters of the TSV using an extraction unit within the EDA tool.

15. The method of claim 14, wherein the TSV sub-circuit comprises a RLCKG network.

16. The method of claim 14,
   wherein the through-silicon via (TSV) model respectively represents the one or more through-silicon vias (TSVs) as one or more circuit components; and
   wherein the interposer substrate model models the interposer substrate as a floating node to enable accurate modeling of cross-substrate coupling between conductive elements within the interposer substrate.

17. The method of claim 16, wherein the interposer wafer model comprises:
   a first capacitor connected between a TSV model and the floating node; and
   a second capacitor connected between the floating node and an additional conductive element within the interposer.

18. The method of claim 16, wherein the interposer wafer model is configured to enable modeling of cross-substrate coupling between conductive elements within the interposer substrate.

* * * * *